United States Patent [19]
Jiang

[11] Patent Number: 6,144,331
[45] Date of Patent: Nov. 7, 2000

[54] ANALOG TO DIGITAL CONVERTER WITH A DIFFERENTIAL OUTPUT RESISTOR-DIGITAL-TO-ANALOG-CONVERTER FOR IMPROVED NOISE REDUCTION

[75] Inventor: Yi Jiang, Plano, Tex.

[73] Assignee: Texas Instruments Incorporated, Dallas, Tex.

[21] Appl. No.: 09/057,385

[22] Filed: Apr. 8, 1998

[51] Int. Cl.[7] .............................. H03M 1/66; H03M 1/12
[52] U.S. Cl. ........................................... 341/172; 341/150
[58] Field of Search ..................................... 341/172, 150, 341/145, 162, 108, 156, 118, 161, 136; 307/109; 327/72

[56] References Cited

U.S. PATENT DOCUMENTS

| | | | |
|---|---|---|---|
| 4,097,753 | 6/1978 | Cook et al. | 327/72 |
| 4,200,863 | 4/1980 | Hodges et al. | 341/156 |
| 4,385,286 | 5/1983 | Haque | 341/108 |
| 4,641,130 | 2/1987 | Mastroianni | 341/136 |
| 4,651,132 | 3/1987 | Lillis et al. | 341/118 |
| 4,661,802 | 4/1987 | Yukawa | 341/150 |
| 4,843,393 | 6/1989 | Kuraishi | 341/150 |
| 5,621,409 | 4/1997 | Cotter et al. | 341/156 |
| 5,661,483 | 8/1997 | Negahban et al. | 341/161 |
| 5,675,340 | 10/1997 | Hester et al. | 341/156 |
| 5,892,473 | 4/1999 | Shin | 341/150 |
| 5,949,156 | 9/1999 | Groover | 307/109 |

OTHER PUBLICATIONS

Holberg, Allen, "10.6 Mediium–Speed A/D Converters", CMOS Analog Circuit Design, CMOS Digital–Analog and Analog–Digital Converters, p. 560–565.

Hae–Seung Lee, et al., "A Self–Calibrating 15 Bit CMOS A/D Converter", IEEE Journal ofSolid–State Circuits, vol. Sc–19, vol. SC–19, No. 6, Dec. 1984, p. 813–819.

Primary Examiner—Patrick Wamsley
Attorney, Agent, or Firm—Bret J. Petersen; Frederick J. Telecky, Jr.

[57] ABSTRACT

An improved successive-approximation type ADC that uses both charge-scaled and voltage scaled approximation. The present invention provides a high noise immunity, high speed ADC using a differential voltage scaled DAC. The differential voltage scaled output scheme of the present invention advantageously applies voltage scaling to a capacitor on both inputs to the comparator. The dual voltage scaling is preferably done by connecting two switches to each tap on the bottom half of a resistor string, and no switches to the top half of the resistor string, using one set of tap switches for adjusting a charge on capacitor on the first input of the comparator and the second set of tap switches for adjusting a charge on capacitor on the second input of the comparator.

7 Claims, 3 Drawing Sheets

ANALOG TO DIGITAL CONVERTER WITH A DIFFERENTIAL OUTPUT RESISTOR-DIGITAL-TO-ANALOG-CONVERTER FOR IMPROVED NOISE REDUCTION

FIELD OF THE INVENTION

This invention generally relates to analog to digital converters (ADC's) such as those used in computer hard disk drives. More particularly, it relates to an analog to digital converter with a differential resistor digital to analog converter (RDAC) with improved noise reduction capability.

BACKGROUND OF THE INVENTION

Analog-to-digital converters (ADC's) translate an analog voltage or current input signal into a digital representation of that signal. Some ADC architectures include a digital-to-analog converter (DAC), which is a circuit that receives a digital input and, in response, produces a voltage or current that corresponds to an input.

A common type of ADC is known as a successive-approximation ADC. A successive-approximation ADC includes a DAC, a comparator, and a successive-approximation register (SAR). Successive-approximation converters apply a binary search algorithm to determine the closest digital word to match an input signal. Specifically, in the first period, after possibly the reset period, the MSB, is determined. In the second period, the next bit is determined, and so on until all N bits are determined.

Another type of ADC is the charge redistribution (or charge balance) ADC. Generally, this sort of converter operates by first trapping a quantity of charge related to a voltage to be measured in one or more sampling capacitors, and then determining the amount of trapped charge using charge scaling on a capacitive ladder circuit. The ladder circuit typically includes a series of binary-weighted capacitors that each have a common plate connected to the sampling capacitor, with each capacitor in the ladder corresponding to a single bit of the converter. The smallest ladder capacitor corresponds to the least significant bit (LSB) of the converter, and the remaining capacitors are each twice as large as the last, with the largest one corresponding to the most significant bit (MSB) of the converter.

To determine the amount of charge trapped in the sampling capacitor, and hence the value of the voltage to be measured, charge redistribution converters have a SAR to switch the ladder capacitors one at a time between ground and a precise voltage reference. Each time the converter switches a ladder capacitor, the sampling capacitor and the ladder form different capacitive voltage dividers between ground and the reference voltage, and the converter tests the output of each dividers with a comparator. Depending on the result of the test, the converter leaves the tested capacitor connected either to the reference or to ground, and sets its corresponding bit to either a one or a zero. Once the converter has tested every ladder capacitor, it can provide the weighted sum of all of the corresponding bits on a digital output as a measure of the voltage.

FIG. 1 illustrates an example of a successive-approximation ADC that uses a voltage-scaling and charge-scaling charge redistribution DAC. Because this DAC uses a resistor string for voltage-scaling it is also called a resistor DAC (RDAC). In this example prior art ADC, charge scaling with a capacitor ladder to determine the most significant bits is combined with voltage scaling with a resistor ladder to determine the least significant bits.

The servo system of a computer disk drive includes a servo demodulator and an ADC. The servo system receives servo burst signals from certain transducer heads and uses those signals to determine the radial position of the heads on the disk. The disk drive microprocessor can determine the position of the heads in response to the integral of the servo burst over a certain time period. The ADC, which is typically eight to 10 bits wide, converts the integral to a digital value and provides it to the microprocessor. In certain servo systems, the servo demodulator estimates this integral by full-wave rectifying the servo burst, detecting the peaks, and estimating the integral based on an assumption that the waveform is known. In other servo systems, the servo demodulator determines the integral by full-wave rectifying the servo burst and providing the rectified signal to an analog integrator circuit. The latter type of servo demodulator is more accurate and is known as an area integrating servo demodulator (AISD). The AISD is conventionally implemented with analog components in a BiCMOS integrated circuit or chip.

SUMMARY OF THE INVENTION

The present invention introduces an improved successive-approximation type ADC which uses both a charge scaled and voltage scaled DAC. The present invention provides a low noise, high speed ADC using a differential voltage scaled resistor scheme in conjunction with a charge scaled DAC. This improvement over the prior art is particularly important in a noisy environment, where substantial substrate noise is often coupled to the DAC output through various paths. The magnitude and phase of the noise that appears at the DAC output depends on the states of all the switches. In addition, the high-speed requirements of many applications prevent applying the simple solution of adding large filtering capacitors at the DAC output to remove the high frequency noise.

The differential voltage scaled output scheme of the present invention advantageously applies voltage scaling to a capacitor on both inputs to the comparator. The dual voltage scaling is preferably done by connecting two switches to each tap on the bottom half of a resistor string, and no switches to the top half of the resistor string, using one set of tap switches for charging a capacitor on one input of the comparator and the second set of tap switches for charging a capacitor on the other input of the comparator.

An advantage of the present invention is elimination of the chip real estate or area need for PMOS switches on the resistor ladder taps over prior art designs. Since the voltage output of the resistor ladder is always at or below the middle rail voltage, the tap switches can be small NMOS switches.

Two additional advantages of the present invention flow from NMOS only switches. First, the overall settling of the DAC will be much faster because only about one-fourth the number of switches are tied to each output of the resistor string. And second, the reduced number of switches provides a reduced path for substrate noise coupling to the resistor string output nodes. In addition, the differential structure of the present invention will cancel much of the noise coupled even in the worse case where the selected taps are the maximum distance apart since the maximum distance is still only half the full range of the prior art structures.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
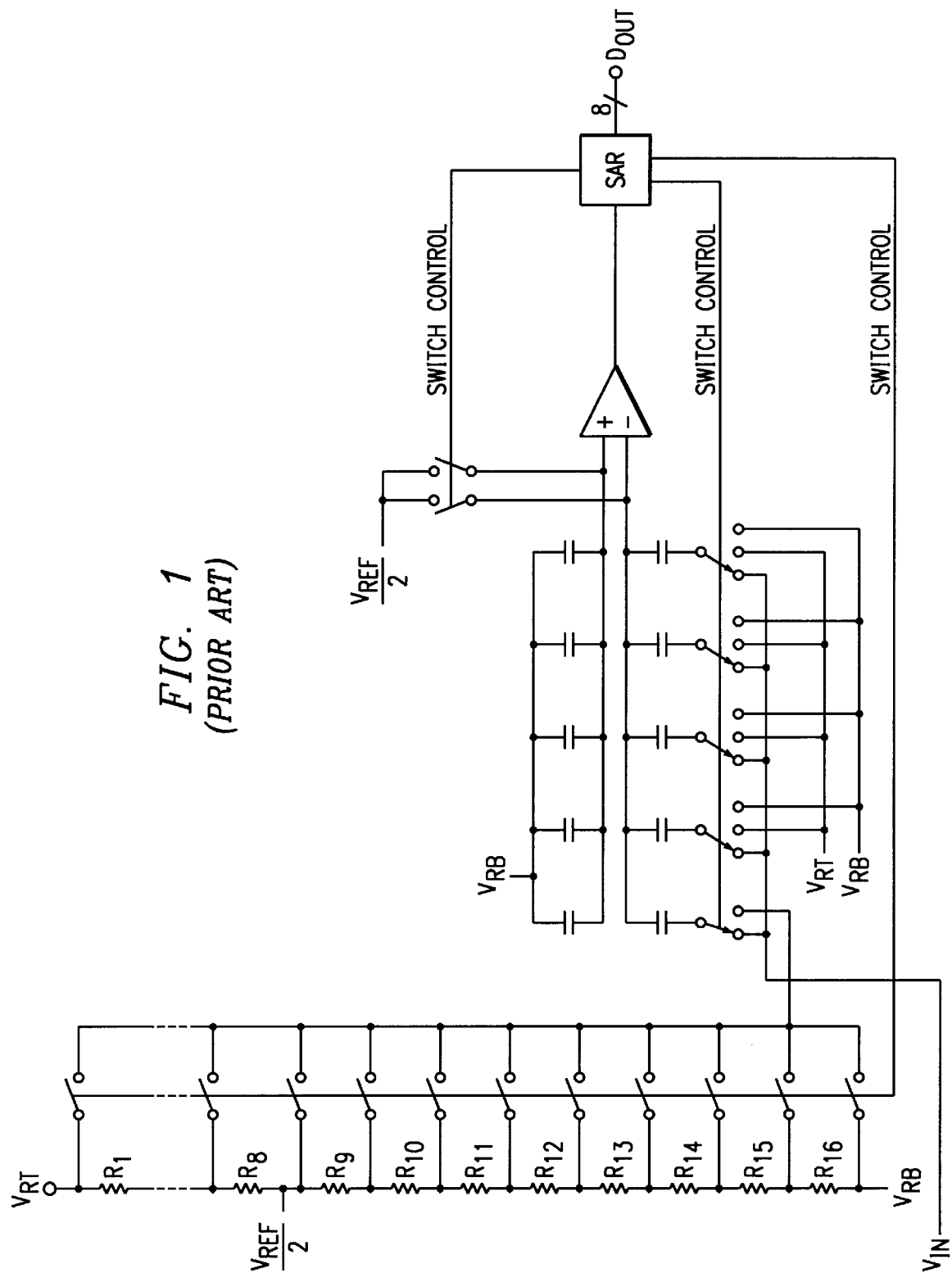
FIG. 1 A prior art successive-approximation ADC that uses a voltage-scaling and charge-scaling charge redistribution DAC.
Figure 2:
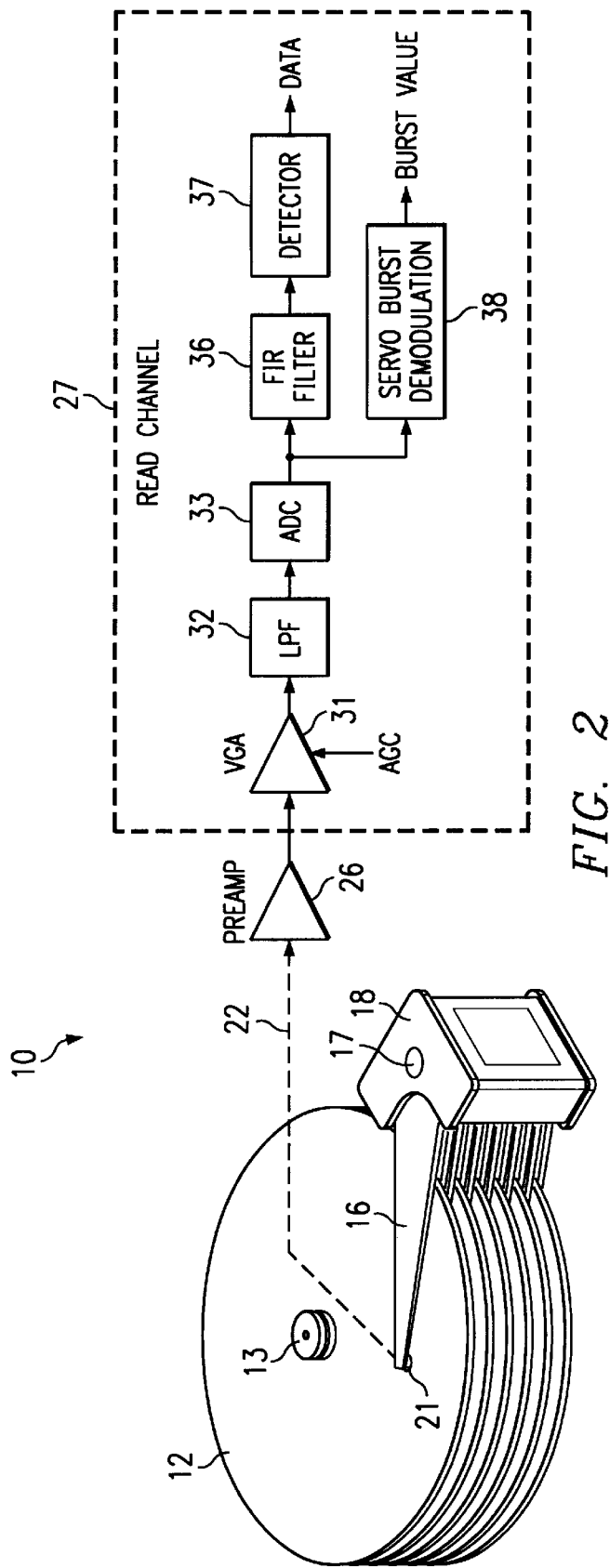
FIG. 2 A hard disk drive having a ADC according to an embodiment of the present invention.

FIG. 2 is a diagrammatic view of part of a hard disk drive system 10 that embodies the present invention. The system 10 includes a plurality of magnetic disks 12, which are fixedly secured to a spindle 13 that is rotationally driven by a not-illustrated spindle motor. A plurality of arms 16 are supported for pivotal movement about an axis defined by a pivot axle 17, pivotal movement of the arms 16 being effected under control of a voice coil motor 18. At the outer end of each arm is a read/write head 21. The head 21 includes respective portions that serve as a read head and a write head.

As shown diagrammatically at 22, the output of the read head is coupled to an input of a preamplifier 26. The output of the preamplifier 26 is coupled to an input of a read channel circuit 27. The read channel circuit 27 includes a variable gain amplifier (VGA) 31, which facilitates an automatic gain control (AGC) function. The input to the VGA 31 is coupled to the output of the preamplifier 26, and the output of the VGA 31 is coupled to an input of a low pass filter (LPF) 32. The output of the LPF 32 is coupled to the input of an analog-to-digital converter (ADC) 33. The output of the ADC 33 is coupled to an input of a finite input response (FIR) filter 36, the output of which is coupled to an input of a digital data detector 37.

The output of the ADC 33 is also coupled to an input to a servo burst demodulation circuit 38. Alternatively, the input to the servo burst demodulation circuit 38 could be coupled to the output of the FIR filter 36, rather than to the output of the ADC 33. The outputs of the detector circuit 37 and demodulation circuit 38 are both coupled to a not-illustrated control circuit, such as a digital signal processor.

The information stored on the magnetic disk 12 is organized in the form of a plurality of circular tracks that are arranged concentrically with respect to each other. Pivotal movement of the arm 16 causes the head 21 to move radially of the disk 12, so that the head can be radially aligned with a selected one of the tracks. Each of the tracks has portions that store data, and portions that store servo information. The servo information allows the system to identify a selected track, and to achieve and maintain radial alignment of the head 21 with that selected track.

Figure 3:
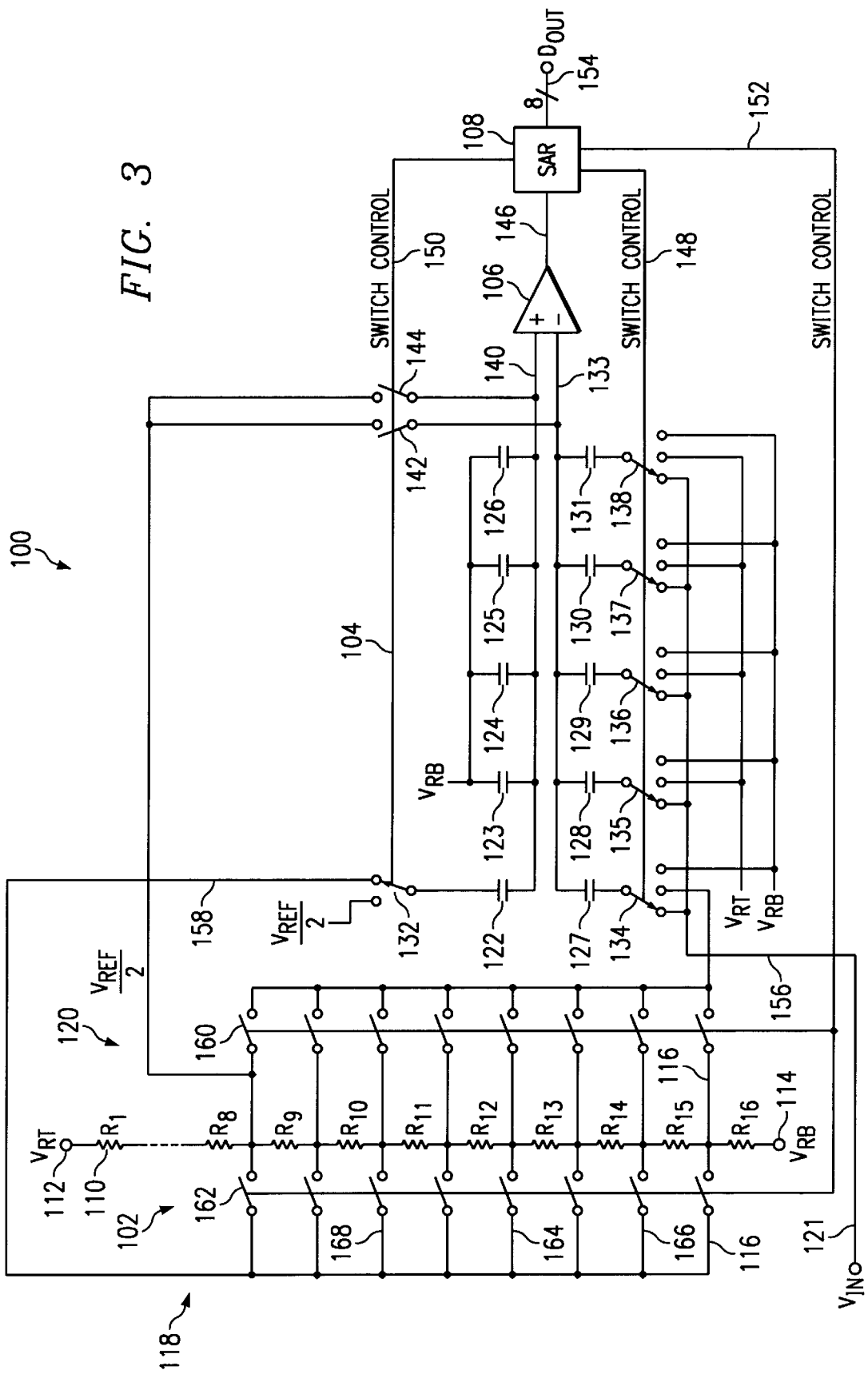
FIG. 3 A differential charge redistribution ADC according to an embodiment of the present invention.

With reference to FIG. 3, there is shown another preferred embodiment of the present invention, an analog to digital converter (ADC) 100 with a differential output resistor digital to analog converter (RDAC). In this embodiment, a successive-approximation ADC is shown using charge-scaling for the 4 most significant bits (MSB's) and voltage-scaling for the 4 least significant bits (LSB's). The illustrated ADC, shown generally at 100, is made of resistor ladder section 102, a capacitor ladder section 104, a comparator 106 and a successive-approximation register 108. The operation and interaction of these sections are described in the following paragraphs.

With further reference to FIG. 3, there is shown a resistor section 102, which provides the LSB's for the illustrated embodiment. Resistor section 102 includes 16 unit resistors 110, shown as $R_1$ and $R_8$ through $R_{16}$. The unit resistors 110 are electrically connected in series between two reference voltages, $V_{RT}$ (voltage reference for resistor string top) 112 and $V_{RB}$ (voltage reference for the resistor string bottom) 114. At each junction of resistors there are two taps or connections to two switches 116 (not all switches are enumerated). The resistors 110 $R_1$ through $R_8$ do not require taps but are used to provide the proper voltage drop for the remaining resistors.

The switches 116 make up a left bank 118 and a Right Bank 120 having 9 switches each. A switch from each bank is connected to one of the resistors $R_8$ through $R_{16}$. The left bank 118 of switches have a commonly connected output which connects to charge adjusting capacitor 122 through a switch 132. The Right Bank 120 of switches have a commonly connected output which connects to charge adjusting capacitor 127 through a switch 134. In this embodiment, the ADC is fabricated in CMOS technology. Thus all the illustrated devices are typical CMOS devices such as CMOS transition gates for switches 116. The SAR 108 controls each of the switches 116 of the resistor section and capacitor section.

Again with reference to FIG. 3, there is shown a capacitor section 104, which provides the MSB's for the illustrated embodiment. Capacitor section 104 includes 10 capacitors 122–131. The first set of capacitors 127–131 each have a top plate commonly connected to an input of the comparator 106, in this case the negative input 133. The bottom plates of capacitors 122–131 are connected to one or more switches controlled by SAR 108. Capacitor 127 has its bottom plate connected to switch 134 to connect the plate to the Right Bank of the resistors as discussed above, to input voltage $V_{in}$ or reference voltage $V_{RB}$. Capacitors 128–131 have their bottom plate connected to switches 135–138. Switches 135–138 connect the bottom capacitor plates to one of three voltages, $V_{IN}$ 121 (during sampling), reference voltage $V_{RT}$ 112 or $V_{RB}$ 114.

Similarly, a second set of capacitors 122–126 each has a top plate commonly connected to a second input of the comparator 106, in this case the positive input. Capacitor 122 has its bottom plate connected to switch 132 to connect the plate to the left bank of the resistors as discussed above, or to reference voltage $V_{ref}/2$. Capacitors 123–126 have their bottom plate connected to reference voltage $V_{RB}$. Capacitors 122–131 have capacitance values to provide weighted capacitance as is commonly known in the art. For example, capacitors 122 and 123 have a capacitance value of C, and capacitors 124–126 have the values of 2C, 4C and 8C respectively. Likewise, capacitors 127 and 128 have a capacitance value of C, and capacitors 129–131 have the values of 2C, 4C and 8C respectively.

Comparator 106 has inputs 140,133 from the capacitor section as described above. Further, comparator 106 has reset switches 142 and 144 connected to inputs 140, 133 such that comparator inputs 140,133 can be reset to $V_{ref}/2$ during the sample period when a new analog input voltage is established on the capacitors of the capacitor section. Output 146 of comparator 106 is connected to SAR 108. SAR 108 has switch control outputs 148,150 and 152, which control the switches as described in the above paragraphs. SAR 108 has additional output 154 to output the digital output for ADC 100.

The operation of the above-described embodiment 100 will now be described. The embodiment circuit described above is designed to take an analog input $V_{IN}$ and convert it to an eight bit digital representation. In this embodiment, conversion of a sampling of input $V_{IN}$ is described as a conversion process. At the start of the conversion process there is a sampling period. The sampling period is followed by a sequence of periods to determine by successive-approximation the input $V_{IN}$. These periods, like the sampling period are a single clock period in the described preferred embodiment.

At the start of the conversion process there is a sampling period. During the sampling period switches 142 and 144 are closed to connect inputs of comparator 106 to known reference voltage in order to establish a reference charge on capacitors 122 through 131. At this time, switches 134–138 are closed to connect capacitors 127 through 131 to $V_{IN}$. Switches 142 and 144 are then opened after $V_{IN}$ is settled on the capacitors, preferably within the one clock sampling period, and remain open for the remainder of the conversion process. During this sampling period, switch 132 connects capacitor 122 to $V_{ref}/2$.

After the sampling period, the first four MSB's are determined by successive-approximation with the charge scaling technique similar to some prior art ADCs. This is accomplished by switching the bottom capacitor plates of scaled capacitors 128–131 to $V_{RT}$ or $V_{RB}$ and comparing to the reference charge stored on the capacitors with comparator 106. Each of the four bits is usually determined in a single clock period.

To determine the first bit, switches 134–137 are controlled by SAR 108 to select the $V_{RB}$ input to bottom capacitor plates 127–130, and switch 132 continues to select the $V_{REF}/2$ input to capacitor 122. Since capacitor 131 is half of the total capacitance, the middle rail of possible voltages for comparison with $V_{IN}$ is obtained by connecting capacitor 131 with $V_{RT}$. At the end of the clock cycle for this bit, SAR 106 determines the output of comparator 106 to be either high or low. If the output is high, indicating $V_{IN}$ is greater than the approximating voltage $V_{REF}/2$, then SAR 106 determines the first bit is 1 and sets the switch 138 to select $V_{RT}$ for the remainder of this conversion process. If however the output is low, indicating $V_{IN}$ is lower than the approximating voltage, then SAR 106 determines the first bit is 0 and sets the switch 138 to select $V_{RB}$ for the remainder of this conversion process.

Similarly, each of the next 3 bits of the digital representation for analog input $V_{IN}$ is found by successive-approximation. SAR 106 then continues to hold switches 135–138 to $V_{RT}$ or $V_{RB}$ as determined for the first four bits. The next four bits are for the illustrated embodiment are then determined by the differential voltage scaling technique according to the present invention in combination with capacitors 122 and 127.

Bit 5 of the digital output or digital representation of the sampled input $V_{IN}$ is determined by charging Capacitor 122 or 127 with an RDAC structure. In the illustrated embodiment the RDAC has two taps per resistor intersection on the bottom half of the resistor string as described above. One bank of taps is used to control charge on capacitor 122 and the other bank to control charge on capacitor 127.

For the illustrated embodiment, Bit 5 and the remaining bits are determined as follows. As described above, switches 134 and 132 were controlled to select $V_{RB}$ and $V_{REF}/2$ respectively. Beginning at the start of bit 5 and for the remaining portion of the conversion process, these switches are selected to connect capacitors 127 and 122 to their resistor string inputs 156, 158. For bit 5, SAR 106 closes the two top resistor string switches 160, 162. Closing these two switches 160, 162 keeps the voltage at the bottom plate of capacitor 122 at the same level as prior to bit 5, and moves the voltage at the bottom plate of capacitor 127 up to $V_{REF}/2$ from $V_{RB}$.

At the end of the clock cycle for bit 5, SAR 106 determines the output of comparator 106 to be either high or low. If the output is high, indicating $V_{IN}$ is greater than the approximating voltage, then SAR 106 determines bit 5 is 1 and sets the switch 160 to remain closed for the remainder of this conversion process. Bits 6 through 8 will then continue with successive-approximation with switch bank 118. If however the output is low, indicating $V_{IN}$ is lower than the approximating voltage, then SAR 106 determines bit 5 is 0 and sets the switch 162 to remain closed for the remainder of this conversion process. Bits 6 through 8 will then continue with successive-approximation with switch bank 120.

In the case where bit 5 is 1, SAR 106 sets the switch 160 to remain closed while continuing the successive-approximation conversion process to determine bits 6 through 8 with switch bank 118. In this case, bit 6 would be determined by adjusting the charge on capacitor 122 with switch bank 118. SAR 106 closes switch 164 to connect the mid point of the bottom half of the resistor string to capacitor 122. If comparator 106 indicates to SAR 108 a positive value, then bit 6 is set to 1 and the conversion process continues by closing switch 166. Otherwise if comparator 106 indicates to SAR 108 a negative value, then bit 6 is set to 0 and the conversion process continues by closing switch 168. In the same manner bits 7 and 8 are determined with the remaining switches of switch bank 118.

In the case where bit 5 is 0, SAR 106 sets the switch 162 to remain closed while continuing the successive-approximation conversion process to determine bits 6 through 8 with switch bank 120. In this case, bit 6 would be determined by adjusting the charge on capacitor 127 with switch bank 120. The remaining bits 7 and 8 would be determined in the same manner as describe in the previous paragraph except the comparisons would move in the opposite direction for a positive detection by the comparator. Thus, for this embodiment, the approximation continues down for a positive on the left bank, while on the Right Bank it would continue up for a positive.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. For example, the number of bits used in the charge scaling or voltage scaling could be altered, and the number of total bits could be changed. Also, the voltage references could be modified and the circuit described could be used in combination with other ADC circuits.

What is claimed is:

1. An analog to digital converter circuit comprising:
   a. a comparator having a first and second input;
   b. a controller circuit;
   c. one or more capacitors connected as capacitor ladders to each of said first and second inputs of said comparator; and
   d. a voltage scaling circuit controlled by the controller circuit for scaling the voltage on one plate of at least one capacitor connected to said first input and for scaling the voltage on one plate of at least one capacitor connected to said second input.

2. The analog to digital converter according to claim 1, wherein said voltage scaling circuit further comprises a resistor ladder having a first and second set of switches with said first set of switches operatively connected to allow said controlling circuit to scale the voltage applied to said at least one capacitor connected to said first input and said second set of switches operatively connected to scale the voltage applied to said at least one capacitor connected to said second input.

3. The analog to digital converter according to claim 1, wherein said resistor ladder has tap connections to said first and second set of switches on only the bottom one half of the resistor ladder.

4. An analog to digital converter circuit comprising:
   a. a comparator having a first and second input;
   b. a controller circuit having a successive-approximation register;
   c. first and second capacitor ladders having a plurality of capacitors connected in parallel, with one terminal of said first ladder connected to said first input of said comparator, and with one terminal of said second ladder connected to said second input of said comparator; and
   d. a voltage scaling circuit operable to scale the voltage on one plate of one capacitor connected to each of said capacitor ladders connected to said comparator further comprising:
      i. a resistor ladder having a plurality of serially connected resistors connected between two reference voltages;
      ii. a first set of switches operatively connected to allow said successive-approximation register to scale the voltage applied to said at least one capacitor connected to said first comparator input; and
      iii. a second set of switches operatively connected to scale the voltage applied to said at least one capacitor connected to said second comparator input.

5. The analog to digital converter according to claim 4, wherein said resistor ladder has a top half and a bottom half and said first and second set of switches are both connected to said bottom half, wherein one of each set of switches is connected to an intersection of two resistors of said resistor string.

6. A hard disk drive for a computer system comprising:
   a. a preamp for amplifying an analog signal detected by a disk head;
   b. An ADC converter for converting said analog signal to a digital signal comprising:
      1. a comparator having a first and second input; controller circuit having a successive-approximation register;
      2. first and second capacitor ladders having a plurality of capacitors connected in parallel, with one terminal of said first ladder connected to said first input of said comparator, and with one terminal of said second ladder connected to said second input of said comparator; and
      3. a voltage scaling circuit operable to scale the voltage on one plate of one capacitor connected to each of said capacitor ladders connected to said comparator further comprising:
         i. a resistor ladder having a plurality of serially connected resistors connected between two reference voltages;
         ii. a first set of switches operatively connected to allow said successive-approximation register to scale the voltage applied to said at least one capacitor connected to said first comparator input; and
         iii. a second set of switches operatively connected to scale the voltage applied to said at least one capacitor connected to said second comparator input.

7. The hard disk drive according to claim 6, wherein said resistor ladder has a top half and a bottom half and said first and second set of switches are both connected to said bottom half, wherein one of each set of switches is connected to an intersection of two resistors of said resistor string.

* * * * *